(12) United States Patent
Lai et al.

(10) Patent No.: US 9,955,588 B1
(45) Date of Patent: Apr. 24, 2018

(54) MULTILAYER CARRIER FOIL

(71) Applicant: Chang Chun Petrochemical Co., Ltd., Taipei (TW)

(72) Inventors: Yao-Sheng Lai, Taipei (TW); Kuei-Sen Cheng, Taipei (TW); Jui-Chang Chou, Taipei (TW)

(73) Assignee: CHANG CHUN PETROCHEMICAL CO., LTD., Taipei (TW)

( * ) Notice: Subject to any disclaimer, the term of this patent is extended or adjusted under 35 U.S.C. 154(b) by 0 days.

(21) Appl. No.: 15/361,983

(22) Filed: Nov. 28, 2016

(51) Int. Cl.
*H05K 1/00* (2006.01)
*H05K 3/46* (2006.01)
(Continued)

(52) U.S. Cl.
CPC ....... *H05K 3/4644* (2013.01); *H01L 21/4857* (2013.01); *H01L 23/49822* (2013.01); *H05K 1/09* (2013.01); *H05K 3/022* (2013.01); *H05K 3/22* (2013.01); *H05K 3/303* (2013.01); *H05K 2201/015* (2013.01);
(Continued)

(58) Field of Classification Search
CPC ........ H05K 3/4644; H05K 1/09; H05K 3/007; H05K 3/0097; H05K 3/101; H05K 3/22; H05K 3/022; H05K 3/303; H05K 3/421; H05K 3/4682; H05K 3/4658; H05K 3/4611; H05K 2201/0141; H05K 2201/015; H05K 2201/03; H05K 2201/0338; H05K 2201/0355; H05K 2203/107; H05K 2203/1536; H05K 3/025; H05K 2203/0315; H05K 3/205; H05K 3/4007; H05K 2203/0152; H05K 2203/0156; H05K 2203/0307; H05K 2203/0723; H05K 2203/0726; B32B 15/01; B32B 15/08; B32B 15/20; H01L 21/4858; H01L 23/49822; H01L 21/4857; C22C 9/00; C25D 1/04; C25D 1/20; C25D 3/38; C25D 5/12; C25D 5/48; C25D 5/10;
(Continued)

(56) References Cited

U.S. PATENT DOCUMENTS 9,210,816 B1  12/2015  Roh et al.
2004/0038049 A1*  2/2004  Suzuki .................. B32B 15/08
                                                      428/457

(Continued)

FOREIGN PATENT DOCUMENTS

JP    5830635 B1    12/2015

*Primary Examiner* — Timothy Thompson
*Assistant Examiner* — Guillermo Egoavil
(74) *Attorney, Agent, or Firm* — Nixon Peabody LLP; Eduardo J. Quinones; Thomas P. Pavelko

(57) ABSTRACT

The present disclosure relates to a multilayer carrier foil, a core structure formed using the multilayer carrier foil, printed circuit boards, and electronic devices. The multilayer carrier foil comprises: (a) a copper carrier layer having a release side and a laminate side, the laminate side of carrier layer optionally having nodules; (b) a chromium release layer applied to the copper carrier layer; (c) an intermediate copper layer applied to the chromium release layer; (d) an anti-migration layer applied to the intermediate copper layer of (c); and (e) an ultra-thin copper layer applied to the anti-migration layer of (d). The disclosure further relates to methods of making the multi-layer carrier foil, the core structure, and printed circuit boards.

19 Claims, 8 Drawing Sheets

(51) Int. Cl.
*H01L 23/498* (2006.01)
*H01L 21/48* (2006.01)
*H05K 3/02* (2006.01)
*H05K 1/09* (2006.01)
*H05K 3/30* (2006.01)
*H05K 3/22* (2006.01)

(52) U.S. Cl.
CPC ............... *H05K 2201/0141* (2013.01); *H05K 2201/0338* (2013.01); *H05K 2201/0355* (2013.01); *H05K 2203/107* (2013.01)

(58) Field of Classification Search
CPC . C25D 5/022; C25D 7/0614; Y10T 428/2495; Y10T 428/31678
USPC ............ 174/250, 255; 216/13; 428/457, 213
See application file for complete search history.

(56) References Cited

U.S. PATENT DOCUMENTS

| | | | |
|---|---|---|---|
| 2007/0190237 A1* | 8/2007 | Kyozuka ............... | H05K 3/0058 427/97.3 |
| 2011/0209903 A1* | 9/2011 | Uno ........................ | B32B 15/01 174/255 |
| 2014/0054259 A1* | 2/2014 | Tateoka ................. | H05K 3/022 216/13 |
| 2016/0212857 A1* | 7/2016 | Miyoshi ............... | C25D 7/0614 |

* cited by examiner

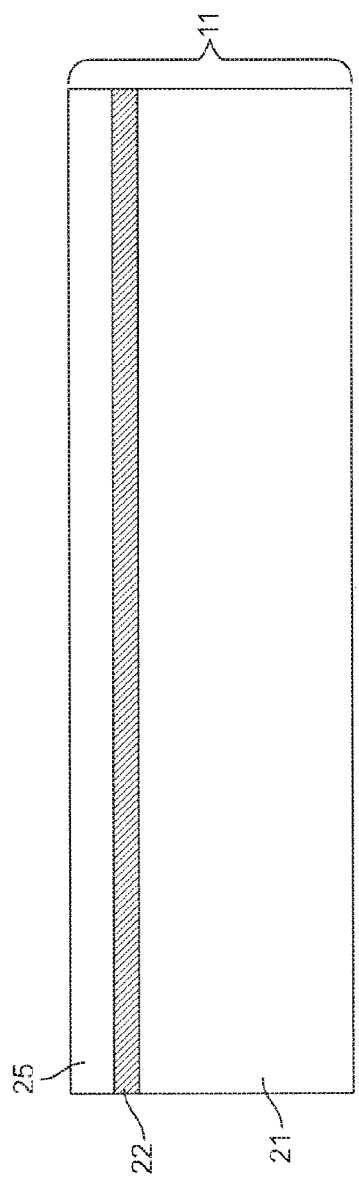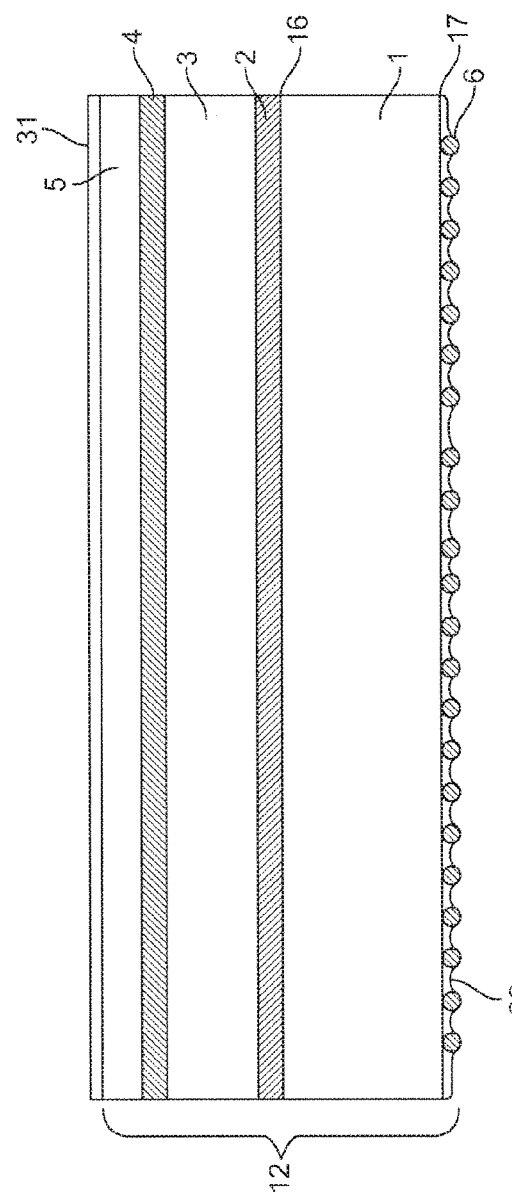

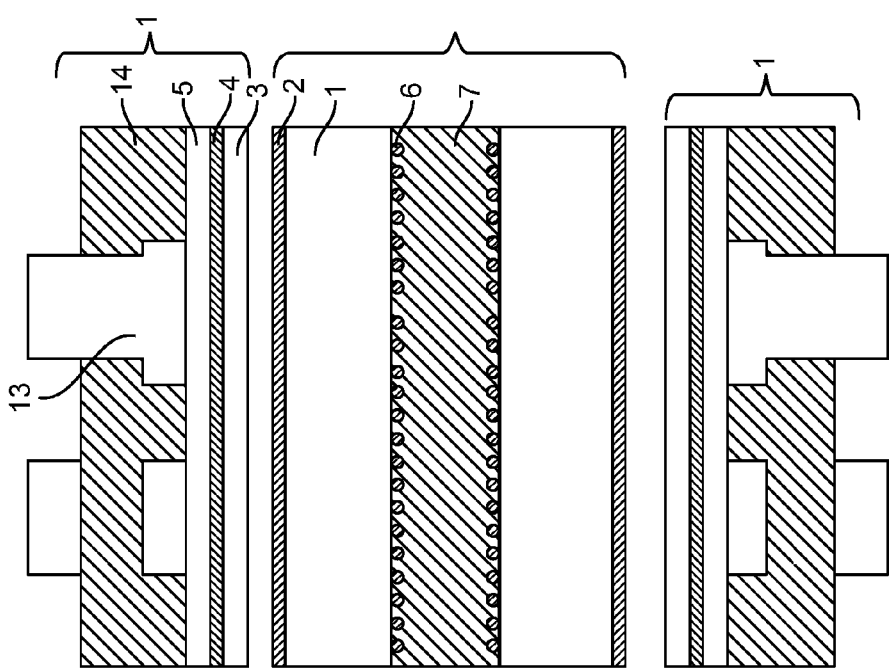

MULTILAYER CARRIER FOIL

FIELD OF THE DISCLOSURE

The present disclosure relates to a multi-layer carrier foil, a core structure formed using the multilayer carrier foil, printed circuit boards, and electronic devices that include the printed circuit boards. The disclosure further relates to methods of making the multi-layer carrier foil, the core structure, and the printed circuit boards.

BACKGROUND

As the electronics industry trends towards lighter, thinner and more miniaturized electrical components, the demand for precise circuitry and thin copper foil has increased. Consumer electronics are requiring more integrated circuits in an integrated circuit package while paradoxically providing less physical space to house the increased integrated circuit package. Electrodeposited copper foil including a carrier foil can be used by the electronics industry for manufacturing high precision and density circuitry in printed circuit board assemblies.

There are two general types of electrodeposited copper foil that include a carrier foil, the peelable-type and the etchable-type. The peelable-type is defined by physically removing the carrier foil after the formation of the copper clad laminate substrate while the etchable-type is defined by chemically removing the carrier foil after the formation of the copper clad laminate substrate. Conventionally, peelable-type electrodeposited copper foils with a carrier have been widely employed for producing copper-clad laminates, by laminating the copper foil with a substrate through hot pressing and then peeling off the carrier attached to the electrodeposited copper foil. The peel strength at the release interface between the carrier and the copper foil varies over a wide range. Some electrodeposited copper foils with carrier layers exhibit easy peeling during handling while others fail to adequately peel after hot pressing.

The conventional electrodeposited copper foil includes a carrier foil (copper or aluminum foil), a release layer often formed with metal oxides or organic compounds on the carrier foil, and a ultra-thin (or super-thin) copper foil that is formed on the release layer. When the carrier foil is physically removed from the ultra-thin copper foil, the surface of the ultra-thin copper foil has a shiny appearance. However, when the ultra-thin copper foil is applied to inner layers of a multilayer circuit board, a blackening or browning process is used to enhance bonding to the substrate.

Ultra-thin copper foil that is used for micro-thin circuit patterns is often formed by electrolytic deposition directly on a release layer of the carrier foil. An ideal thickness for the ultra-thin copper is below 5 μm. The surface morphology of the carrier foil directly impacts the release layer and the ultra-thin copper foil. Thus, when the carrier layer surface roughness is high, the subsequent electroplated ultra-thin copper foil also tends to have a high roughness, thereby influencing the subsequent etching. Likewise, if the carrier foil has pinholes, the ultra-thin copper foil will also tend to have pinholes. Because the carrier foil is the basis for the release layer and the ultra-thin copper foil, the choice of the carrier copper foil can be very important.

During the manufacturing of printed circuit boards, high density and precision circuitry components such as microvias are often created using laser drilling. The shiny surface of the ultra-thin copper foil, however, has a tendency to reflect the laser rays. Therefore, stronger laser rays are required, which consume more energy. Furthermore, during high temperature compression process, the temperature of the ultra-thin copper foil can reach as high as 300° C., and the metallic bonding formed via an oxidation-reduction reaction between the metal oxides and the copper metal may affect consistency in peeling strength.

Recently, multilayer structures have been widely employed in printed wiring boards for miniaturization of the printed wiring boards by increased wiring density of the printed wiring boards. Multilayer printed wiring boards are used in many mobile electronic devices to achieve downsizing. Accordingly, multilayer printed wiring boards require both further thickness reduction in interlayer insulating layers and further weight reduction.

Consumer electronics requirements demand more integrated circuits in an integrated circuit package while paradoxically providing less physical space in the system for the increased integrated circuits content. As a technology which satisfies such requirements, a manufacturing method employing the coreless build-up method have been used. In the coreless build-up method, a copper foil with carrier foil has been utilized for separation between the supporting substrate and the multilayer printed wiring board. As the patterns were built on ultra-thin copper layer, fine pitch was achieved.

SUMMARY OF THE DISCLOSURE

The present disclosure relates to a multilayer carrier foil and methods for manufacturing the multilayer carrier foil; a core structure comprising the multilayer carrier foil and methods for manufacturing the core structure; a method for manufacturing printed circuit boards ("PCBs") and circuit boards made from the methods; and electronic devices comprising the PCBs. The multilayer carrier foil is unique in its design and utility. For example, it is particularly useful in a new and innovate manufacturing process for high quality PCBs.

The multilayer carrier foil of the instant disclosure typically comprises: (a) a copper carrier layer having a release side and a laminate side, the laminate side of copper carrier layer optionally having nodules; (b) a chromium release layer applied to the release side of the copper carrier layer; (c) an intermediate copper layer applied to the chromium release layer; (d) an anti-migration layer applied to the intermediate copper layer; and (e) an ultra-thin copper layer applied to the anti-migration layer.

The multilayer carrier foil described above can be used to create a core structure and can subsequently be used in the manufacture of PCBs. The core structure includes an inner substrate layer sandwiched between sheets of the multilayer carrier foil. The laminate side (optionally including nodules) of the multilayer carrier foil is attached to each side of the core structure.

The manufacture of a PCB, according to the instant disclosure, typically involves manufacturing a core structure, as described above, and further processing the core structure. For example, the manufacture of a PCB may comprise:

i. obtaining a multilayer carrier foil comprising (a) a copper carrier layer having a release side and a laminate side, the laminate side of copper carrier layer optionally having nodules; (b) a chromium release layer applied to the release side of the copper carrier layer of (a); (c) an intermediate copper layer applied to the chromium release layer of (b); (d) an anti-migration layer applied to the intermediate copper layer of (c); and (e) an ultra-thin copper layer applied to the anti-migration layer of (d);

ii. forming a core structure comprising an inner substrate layer sandwiched between sheets of the multilayer carrier foil, wherein both sides of the inner substrate layer attach to the laminate side of a sheet of the copper carrier foil;

iii. patterning an exposed surface of the ultra-thin copper layers;

iv. applying an outer substrate layer to the patterned ultra-thin copper layers;

v. obtaining a conventional carrier foil comprising (A) a conventional copper carrier layer; (B) a conventional chromium or organic release layer applied to the conventional copper carrier layer; and (C) a conventional ultra-thin copper layer applied to the conventional chromium or organic release layer; and applying the conventional ultra-thin copper layer of the conventional carrier foil to the outer substrate layer of (iv) the patterned ultra-thin copper layers;

vi. removing the conventional copper carrier layers and the conventional copper chromium release layers from the conventional ultra-thin copper layers;

vii. forming openings through the conventional ultra-thin copper layers and the outer substrate layers;

viii. filing the openings with a conductive material (such as copper) and forming a pattern;

ix. separating the patterned conventional ultra-thin copper layers, which are attached to the outer substrates, which are attached to the anti-migration layers, which are attached to the intermediate copper layers from the chromium release layers;

x. removing the intermediate copper layers, the anti-migration layers, and the ultra-thin copper layers to form a remaining patterned outer substrate layer; and xi. bonding the remaining patterned outer substrate layer to an electronic device.

The instant disclosure additionally relates to PCBs manufactured according the process described above; and to electronic devices comprising the PCBs.

BRIEF DESCRIPTION OF THE DRAWINGS

Implementations of the present technology will now be described, by way of example only, with reference to the attached figures, wherein:

FIG. 1 is a depiction of a conventional multilayer carrier foil;

FIG. 2 is a depiction of multilayer carrier foil according to the instant disclosure;

FIG. 14 is a depiction showing detachment along the chromium release layers of the patterned outer substrate layers, the ultra-thin copper layers, the anti-migration layers, and the intermediate copper layers;

FIG. 15 is a depiction of the patterned outer substrate layer after removal of the intermediate copper layers, the anti-migration layers, and the ultra-thin copper layers; and FIG. 16 is depiction of the patterned outer substrate layer of FIG. 15 bonded to an electrical device.

Figure 3:
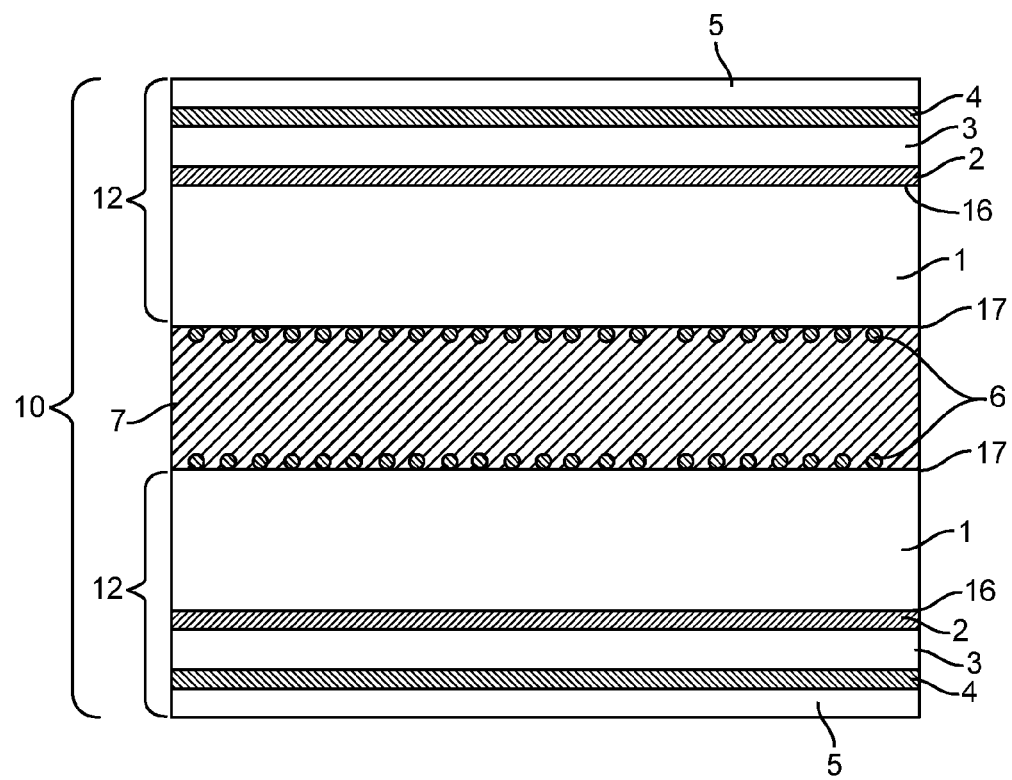
FIG. 3 is a depiction of a core structure having an inner substrate layer sandwiched between two sheets of a multilayer carrier foil according to the instant disclosure.

It should be understood that the various aspects are not limited to the arrangements and instrumentality shown in the drawings. For example, the drawings and the description refer to a double sided manufacturing process for the processing with the inner substrate in the manufacture of printed circuit boards. Nonetheless, the process need not include use of both sides of the inner substrate, i.e., the process may be one-sided.

DETAILED DESCRIPTION OF THE DISCLOSURE

The present disclosure relates to a multilayer carrier foil that is particularly useful in the manufacture of printed circuit boards ("PCBs"). Typically, the multilayer carrier foil comprises: (a) a copper carrier layer having a release side and a laminate side, the laminate side of copper carrier layer optionally having nodules; (b) a chromium release layer applied to the release side of the copper carrier layer; (c) an intermediate copper layer applied to the chromium release layer; (d) an anti-migration layer applied to the intermediate copper layer; and (e) an ultra-thin copper layer applied to the anti-migration layer. The plating conditions are not particularly limited, and are arranged in consideration of the characteristics of the production line.

The copper carrier layer (a) is typically an electrodeposited copper foil having a thickness of 10 µm to 50 µm. The thickness of the copper carrier layer may be from 10 µm to 45 µm, 10 µm to 40 µm, 10 µm to 35 µm, 10 µm to 30 µm, 10 µm to 25, or 10 µm to 20 µm. Likewise, the thickness of the copper carrier layer may be from 12 µm to 50 µm, 12 µm to 45 µm, 12 µm to 40 µm, 12 µm to 35 µm, 12 µm to 30 µm, 12 µm to 25 µm or 12 µm 20 µm. Further, the thickness of the copper carrier layer may be from 14 µm to 50 µm, 14 µm to 45 µm, 14 µm to 40 µm, 14 µm to 35 µm, 14 µm to 30 µm, 14 µm to 25 µm, or 14 µm to 20 µm. Finally, the thickness of the copper carrier layer maybe from 15 µm to 30 µm, 15

µm to 25 µm, or 15 µm to 20 µm. Normally, the electrode-posited copper foil contains a drum side and a deposited side. Both the drum side and the deposited side can be used as the release side. Once one side is used as the release side, the opposite side is used as the laminate side.

The chromium release layer (b) typically has a chromium content of 10 µg/dm$^2$ to 40 µg/dm$^2$. In some cases, the chromium content may be from 10 µg/dm$^2$ to 35 µg/dm$^2$, 10 µg/dm$^2$ to 30 µg/dm$^2$, 10 µg/dm$^2$ to 25 µg/dm$^2$, or 10 µg/dm$^2$ to 20 µg/dm$^2$. Likewise, the chromium content may be from 15 µg/dm$^2$ to 40 µg/dm$^2$, 15 µg/dm$^2$ to 35 µg/dm$^2$, 15 µg/dm$^2$ to 30 µg/dm$^2$, 15 µg/dm$^2$ to 25 µg/dm$^2$, or 15 µg/dm$^2$ to 20 µg/dm$^2$. Finally, the chromium content may be 20 µg/dm$^2$ to 40 µg/dm$^2$, 20 µg/dm$^2$ to 35 µg/dm$^2$, 20 µg/dm$^2$ to 30 µg/dm$^2$ The thickness of the intermediate copper layer of (c) is typically about 0.5 µm to about 5 µm. This intermediate copper layer helps prevent pinholes from forming during the peeling of copper carrier layer. Usually, the intermediate copper layer has a smooth surface (Rz≤2 µm).

The thickness of the anti-migration layer of (d) is typically about 0.5 µm to about 3 µm. The anti-migration layer is often a nickel layer, or comprises nickel. Additionally, the anti-migration layer may comprise or consist of cobalt, molybdenum, and/or tungsten.

The thickness of the ultra-thin copper layer (e) is typically about 1 µm to about 8 µm. However, the thickness may be 1 µm to 7 µm, 1 µm to 6 µm, 1 µm to 5 µm, or 1 µm to 4 µm. The thickness may also be 2 µm to 8 µm, 2 µm to 6 µm, 2 µm to 5 µm, 2 µm to 4 µm, or about 3 µm.

An anti-tarnish layer is usually applied to the exposed surface of the ultra-thin copper layer. Additionally, the same or a different anti-tarnish layer can be applied to the exposed surface of the laminate side of the copper carrier layer. A typical anti-tarnish layer consists of chromium, or comprises chromium. The chromium content of the chromium layer is typically from about 10 µg/dm$^2$ to about 50 µg/dm$^2$. The chromium content may be about 10 µg/dm$^2$ to about 40 µg/dm$^2$, about 10 µg/dm$^2$ to about 30 µg/dm$^2$, about 10 µg/dm$^2$ to about 25 µg/dm$^2$, about 20 µg/dm$^2$ to 50 µg/dm$^2$, about 20 µg/dm$^2$ to about 40 µg/dm$^2$, about 20 µg/dm$^2$ to about 30 µg/dm$^2$, about 30 µg/dm$^2$ to about 50 µg/dm$^2$, or about 40 µg/dm$^2$ to about 50 µg/dm$^2$.

In other cases, an organic anti-tarnish layer can be applied. The organic anti-tarnish layer may comprise at least one member selected from the group consisting of triazoles, thiazoles, and imidazoles, or their derivatives, which are selected for their ability to bond to copper. The triazole group includes orthotriazole (1,2,3-triazole) and isomers thereof, or derivatives thereof. Orthotriazole derivatives include benzotriazole, tolyltriazole, carboxybenzotriazole, chlorine substituted benzotriazole, aminotriazole and isomers thereof, or derivatives such as alkali metal salts or amine salts and the like. As the isomers of the aminotriazole, 3-amino-1,2,4-triazole, 2-amino-1,3,4-triazole, 4-amino-1,2,4-triazole and 1-amino-1,3,4-triazole can be used. Examples of derivatives of aminotriazole include sodium salts or amine salts including, for example, monoethanolamine salts, cyclohexylamine salts, diisopropylamine salts, morpholine salts and the like.

Examples of thiazoles and derivatives thereof include thiazole, 2-mercaptobenzothiazole, dibenzothiazyldisulfide, cyclohexylamine salts of 2-mercaptobenzothiazole, dicyclohexylamine salts of 2-mercaptobenzothiazole and the like. Examples of imidazoles and derivatives thereof include imidazole, 2-methylimidazole, 2-ethyl-4-methylimidazole, 2-phenylimidazole, 1-benzyl-2-methylimidazole and the like.

The instant disclosure further relates to a core structure that includes the multilayer copper foil described above. The core structure typically comprises an inner substrate layer that is sandwiched between two sheets of the multilayer carrier foil. For example, the laminate side of the multilayer carrier foil can attach to both sides of the inner substrate. The types of material usable for the inner substrate layer are vast. For example, the inner substrate layer may comprise, for example, a phenolic resin, an epoxy, a bismaleimide triazine, a polyimide, a liquid crystal polymer, a polyphenylene oxide, a polyphenylene ether, a polytetrafluoroethylene, a cyanate ester, or a mixture thereof. The core structure is particularly useful for the manufacture of PCBs.

Additional suitable materials for the inner substrate layer include, for example, reinforced or unreinforced polymers. Suitable polymers include, but are not limited to, epoxy resins or modified epoxy resins, for example bifunctional or polyfunctional Bisphenol A or Bisphenol F resins, epoxy-novolak resins, brominated epoxy resins, aramid-reinforced or glass fiber-reinforced or paper-reinforced epoxy resins (for example FR4), glass fiber-reinforced plastics, liquid-crystal polymers (LCP), polyphenylene sulfides (PPS), poly-oxymethylenes (POM), polyaryl ether ketones (PAEK), polyether ether ketones (PEEK), polyamides (PA), polycarbonates (PC), polybutylene terephthalates (PBT), polyethylene terephthalates (PET), polyimides (PI), polyimide resins, cyanate esters, bismaleimide-triazine resins, nylon, vinyl ester resins, polyesters, polyester resins, polyamides, polyanilines, phenol resins, polypyrroles, polyethylene naphthalate (PEN), polymethyl methacrylate, polyethylene dioxithiophene, phenolic resin-coated aramid paper, polytetrafluoroethylene (PTFE), melamine resins, silicone resins, fluorine resins, allylated polyphenylene ethers (APPE), polyether imides (PEI), polyphenylene oxides (PPO), polypropylenes (PP), polyethylenes (PE), polysulfones (PSU), polyether sulfones (PES), polyaryl amides (PAA), polyvinyl chlorides (PVC), polystyrenes (PS), acrylonitrile-butadiene-styrene (ABS), acrylonitrile-styrene acrylate (ASA), styrene acrylonitrile (SAN) and mixtures (blends) of two or more of the aforementioned polymers, which may be present in a wide variety of forms.

The instant disclosure relates to methods for manufacturing the multilayer carrier foil and the core structure. For example the multilayer carrier foil may be manufactured by: (a) forming a copper carrier layer, as described above, having a release side and a laminate side, the laminate side optionally having nodules; (b) forming a chromium release layer, as described above, on the copper carrier layer; (c) forming an intermediate copper layer, as described above, on the chromium release layer; (d) forming an anti-migration layer, as described above, on the intermediate copper layer; and (e) forming an ultra-thin copper layer on the anti-migration layer.

Methods for manufacturing PCBs and PCBs formed by the methods are also described. For instance, a typical method for manufacturing a PCB comprises:
i. obtaining a multilayer carrier foil, as described above;
ii. forming a core structure comprising an inner substrate layer sandwiched between two sheets of the multilayer carrier foil, wherein both sides of the inner substrate layer attach to the laminate side of each sheet of the copper carrier foil;
iii. patterning an exposed surface of the ultra-thin copper layers;
iv. applying an outer substrate layer to the patterned ultra-thin copper layers;
v. obtaining a conventional carrier foil comprising:
 (A) a conventional copper carrier layer;
 (B) a conventional chromium release layer applied to the conventional copper carrier layer; and
 (C) a conventional ultra-thin copper layer applied to the conventional chromium release layer; and applying the conventional ultra-thin copper layer of the conventional carrier foil to the outer substrate layer of (iv) the patterned ultra-thin copper layers;

vi. removing the conventional copper carrier layers and the conventional copper chromium release layers from the conventional ultra-thin copper layers;

vii. forming openings through the conventional ultra-thin copper layers and the outer substrate layers;

viii. filing the openings with a conductive material (such as copper) and optionally patterning an exposed surface of the conventional ultra-thin copper layers and/or an exposed surface of the filled openings of (viii);

ix. separating the patterned conventional ultra-thin copper layers, which are attached to the outer substrates, which are attached to the anti-migration layers, which are attached to the intermediate copper layers from the chromium release layers;

x. removing the intermediate copper layers, the anti-migration layers, and the ultra-thin copper layers to form a remaining patterned outer substrate layer; and xi. bonding the remaining patterned outer substrate layer to electronic devices.

Patterning an exposed surface of the ultra-thin copper layers or an exposed surface of the conventional ultra-thin copper layers and/or an exposed surface of the filled openings of (viii) can be carried out by any number of methods known in the art. For example, the patterning can be achieved by applying a patterning material (e.g., a patterned photoresist layer) to the exposed surface, patterning the exposed surface with a conductive material by plating or etching, and removing the patterned photoresist layers. In the instant case, the patterning results in a pattern of conductive material being formed, typically by platting.

The patterning process may use a photosensitive material that is capable of being patterned. The patterning material(s) may include, for example, a multi-layer photoresist, such as a tri-layer resist. The patterning material(s) may further include hard mask layers.

The photoresist may be applied to the ultra-thin copper layers, for example, by spin coating. A viscous, liquid solution of photoresist is dispensed onto the ultra-thin copper layers, to produce a uniformly thick layer. The spin coating typically runs at 1200 to 4800 rpm for 30 to 60 seconds, and produces a layer between 0.5 and 2.5 micrometers thick. The spin coating process results in a uniform thin layer, usually with uniformity of within 5 to 10 nanometers. The photo resist-coated ultra-thin copper layers can be prebaked to drive off excess photoresist solvent, typically at 90 to 100° C. for 30 to 60 seconds.

After prebaking, the photoresist may be exposed to a pattern of intense light. The exposure to light causes a chemical change that allows some of the photoresist to be removed by a special solution, called "developer" by analogy with photographic developer. Positive photoresist, the most common type, becomes soluble in the developer when exposed; with negative photoresist, unexposed regions are soluble in the developer. After parts of the photoresist have been removed, a conductive material such as copper can be platted or filled into openings in the photoresist coating to form a conductive pattern on the surface of the ultra-thin copper foil.

After a conductive pattern has been formed onto the surface of the ultra-thin copper layers, the remaining photoresist layer is no longer needed, and can be removed. This can be accomplished using a "resist stripper", which chemically alters the resist so that it no longer adheres to the surface of the ultra-thin copper layers. Alternatively, photoresist may be removed by a plasma containing oxygen, which oxidizes it. This process is called ashing, and resembles dry etching. Use of 1-Methyl-2-pyrrolidone (NMP) solvent for photoresist is another method used to remove an image. When the resist has been dissolved, the solvent can be removed by heating.

Once any remaining photoresist has been removed and a pattern of conductive material exists on the surfaces of the ultra-thin copper layers, an outer substrate layer (iv) can be applied. Like the inner substrate layer discussed above, the types of materials useable for the outer substrate layers are vast. For example, the outer substrate layers may comprise a phenolic resin, an epoxy, a bismaleimide triazine, a polyimide, a liquid crystal polymer, a polyphenylene oxide, a polyphenylene ether, a polytetrafluoroethylene, a cyanate ester, or a mixture thereof.

Additional suitable materials for the outer substrate layers may be formed of reinforced or unreinforced polymers. Suitable polymers include, but are not limited to, epoxy resins or modified epoxy resins, for example bifunctional or polyfunctional Bisphenol A or Bisphenol F resins, epoxy-novolak resins, brominated epoxy resins, aramid-reinforced or glass fiber-reinforced or paper-reinforced epoxy resins (for example FR4), glass fiber-reinforced plastics, liquid-crystal polymers (LCP), polyphenylene sulfides (PPS), polyoxymethylenes (POM), polyaryl ether ketones (PAEK), polyether ether ketones (PEEK), polyamides (PA), polycarbonates (PC), polybutylene terephthalates (PBT), polyethylene terephthalates PF 0000058070/Kai (PET), polyimides (PI), polyimide resins, cyanate esters, bismaleimide-triazine resins, nylon, vinyl ester resins, polyesters, polyester resins, polyamides, polyanilines, phenol resins, polypyrroles, polyethylene naphthalate (PEN), polymethyl methacrylate, polyethylene dioxithiophene, phenolic resin-coated aramid paper, polytetrafluoroethylene (PTFE), melamine resins, silicone resins, fluorine resins, allylated polyphenylene ethers (APPE), polyether imides (PEI), polyphenylene oxides (PPO), polypropylenes (PP), polyethylenes (PE), polysulfones (PSU), polyether sulfones (PES), polyaryl amides (PAA), polyvinyl chlorides (PVC), polystyrenes (PS), acrylonitrile-butadiene-styrene (ABS), acrylonitrile-styrene acrylate (ASA), styrene acrylonitrile (SAN) and mixtures (blends) of two or more of the aforementioned polymers, which may be present in a wide variety of forms.

After the outer substrate has been applied, a conventional carrier foil is then applied to the outer substrate. Conventional carrier foils typically include: (A) a conventional copper carrier layer; (B) a conventional chromium or organic release layer applied to the conventional copper carrier layer; and (C) a conventional ultra-thin copper layer applied to the conventional chromium or organic release layer. In particular, the conventional ultra-thin copper layer of the conventional carrier foil is applied to the outer substrate layers.

Once the conventional carrier foil is applied to the outer substrate layers, the conventional copper carrier layer of (A) and the conventional chromium release layer of (B) is removed so that the conventional ultra-thin copper layer remains on the outer substrate layers. This allows for openings to be formed through the conventional ultra-thin copper layer and through the outer substrate layers. Typically, the openings extend to the conductive pattern on the surface of the ultra-thin copper layer. These opening or holes may be formed by a variety of methods, for example, the openings may be formed with a laser.

The instant disclosure relates to PCBs formed by the methods described above and also relates to electronic devices comprising the PCBs. By way of example only, such electronic devices include, but are not limited to mobile telephones, AC/DC adapters, AC power supplies, computers, multimedia or MP3 players, game consoles, industrial controls, USB, HUB, automobiles, electric vehicles including electric automobiles, tablets, laptops and notebooks, personal digital assistants (PDA) and medical equipment, as well as other portable electronic devices.

FIG. 1 is a depiction of a conventional multilayer carrier foil (11). The conventional multilayer carrier foil (11) includes a conventional copper carrier layer (21), conventional chromium or organic release layer (22) applied to the conventional copper carrier layer (21); and a conventional ultra-thin copper layer (25) applied to the conventional chromium or organic release layer (22). The conventional copper carrier layer (21) typically has a thickness of 10 μm to 50 μm and the conventional ultra-thin copper layer typically has a thickness of about 0.5 μm to 5 μm. These thicknesses can vary, however, as described above.

FIG. 2 is a depiction of multilayer carrier foil according to the instant disclosure ("inventive multilayer carrier foil") (12). The inventive multilayer carrier foil (12) includes a copper carrier layer (1) having a release side (16) and a laminate side (17), the laminate side (17) optionally having nodules (6); a chromium release layer (2) applied to the copper carrier layer (1); an intermediate copper layer (3) applied to the chromium release layer (2); an anti-migration layer (4) applied to the intermediate copper layer (3); and an ultra-thin copper layer (5) applied to the anti-migration layer (4).

As can be seen in FIG. 2, an anti-tarnish layer (31) can be formed on an exposed surface of the ultra-thin copper layer (5) and/or on an exposed surface of the laminate side (17) of the copper carrier layer (1), (wherein the laminate side of the copper carrier layer (1) is shown in FIG. 2 as including the optional nodules (6)) as anti-tarnish layer (32). As described below, the anti-tarnish layers (31) and (32) may comprise chromium formed by immersing the multilayer copper foil in a chromate solution and plated under the action of an electric current to provide the anti-tarnish treatment. The anti-tarnish layers (31) and (32) are omitted from the remainder of the drawings for clarity.

FIG. 3 is a depiction of a core structure (10) having an inner substrate layer (7) sandwiched between two sheets of inventive multilayer carrier foil (12). The optional nodules (6) are shown at the interface between the laminate side (17) of the copper carrier layer (1) and the inner substrate layer (7). In other words, the laminate side (17) of copper carrier layer (1) of a sheet of inventive multilayer carrier foil (12) is applied to each side of the inner substrate layer (7). Optional nodules (6) can be included on the laminate side (17) of the copper carrier layer (1) to improve adhesion between the inner substrate (7) and the copper carrier layer (1). Also shown are the various components of the inventive multilayer carrier foil (12) including the chromium release layers (2), the intermediate copper layers (3), the anti-migration layers (4) and the ultra-thin copper layers (5).

Figures 4, 5:
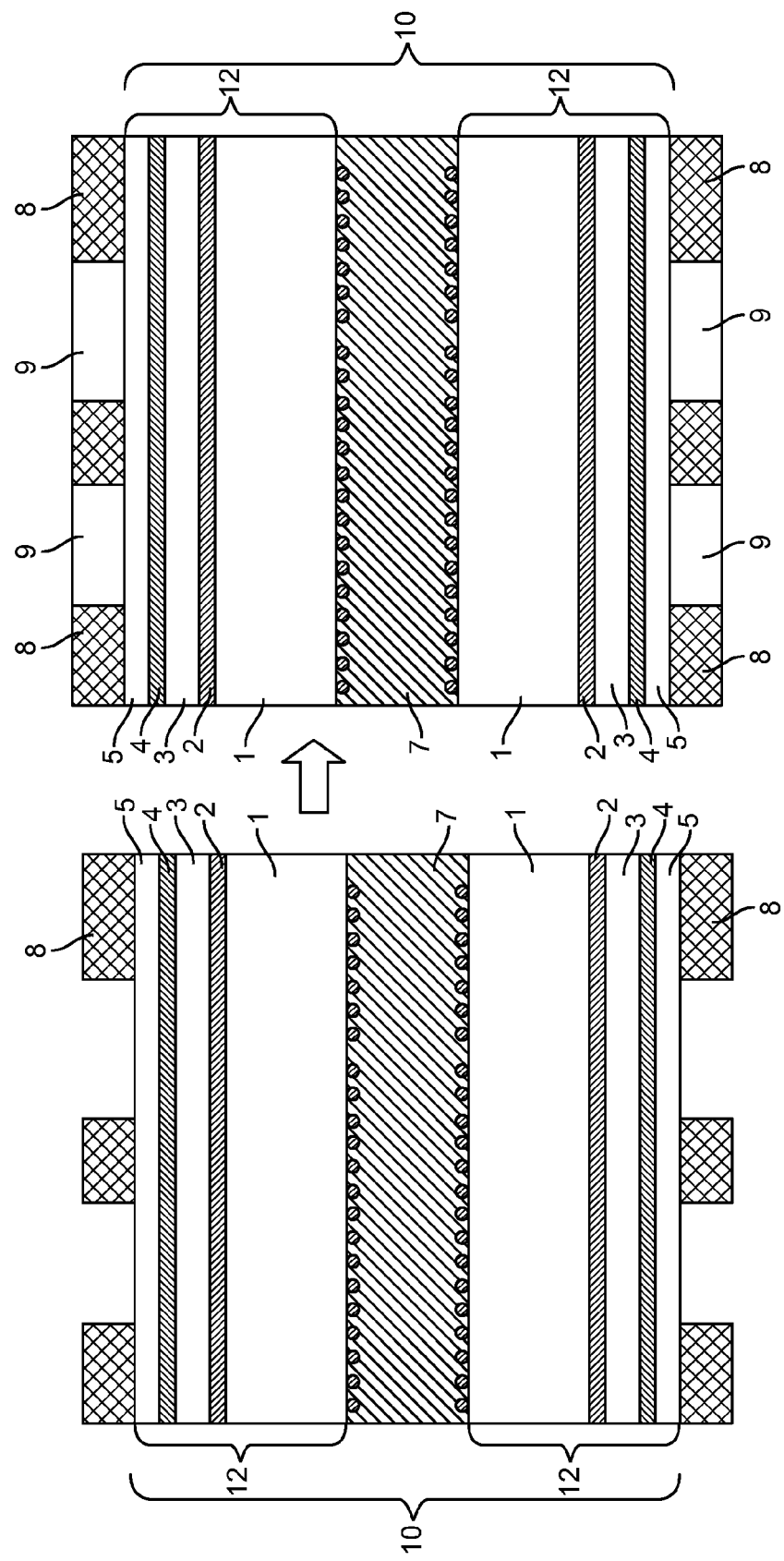
FIG. 4 is a depiction of the core structure of FIG. 3 with photoresist layers added to the outside faces of the ultra-thin copper layers to form a pattern.
FIG. 5 is a depiction of the construct of FIG. 4 with a conductive material patterned onto the outside faces of the ultra-thin copper layers around the photoresist layers.

FIG. 4 is a depiction of the core structure (10) of FIG. 3 with photoresist layers (8) added to the outside faces of the ultra-thin copper layers (5) to form a pattern. The photoresist layers (8) may be applied in a pattern or can be applied so as to completely cover the ultra-thin copper foil (5) and subsequently processed to remove parts of the photoresist layer to form a pattern (e.g., by etching, etc.).

FIG. 5 is a depiction of the construct of FIG. 4 with a conductive material (9) patterned onto the exposed faces of the ultra-thin copper layers (5) around the photoresist layers (8). The conductive material (9) may be copper or another conductive material, such as a conductive metal, and may be patterned onto the outside faces of the ultra-thin copper layers (5).

FIG. 4 is a depiction of the core structure (10) of FIG. 3 with photoresist layers (8) added to the outside faces of the ultra-thin copper foil layers (5) to form a pattern. The photoresist layers (8) may be applied in a pattern or can be applied so as to completely cover the ultra-thin copper foil (5) and subsequently processed to remove parts of the photoresist layer to form a pattern (e.g., by etching, etc.).

FIG. 5 is a depiction of the construct of FIG. 4 with a conductive material (9) patterned onto the exposed faces of the ultra-thin copper foil (5) around the photoresist layers (8). The conductive material (9) may be copper or another conductive material, such as a conductive metal, and may be patterned onto the outside faces of the ultra-thin copper foil (5).

Figure 6:
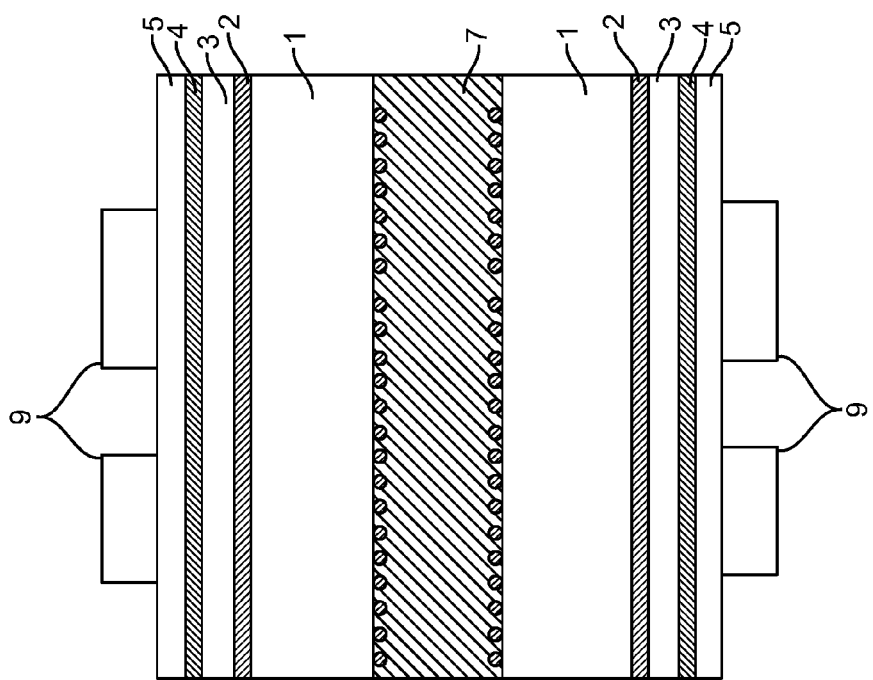
FIG. 6 is a depiction of the construct of FIG. 5 with the photoresist layers removed to expose the pattern of the conductive material.

FIG. 6 is a depiction of the construct of FIG. 5 with the photoresist layers (8) removed so that the pattern of the conductive material (9) on the ultra-thin copper layers (5) is exposed.

Figure 7:
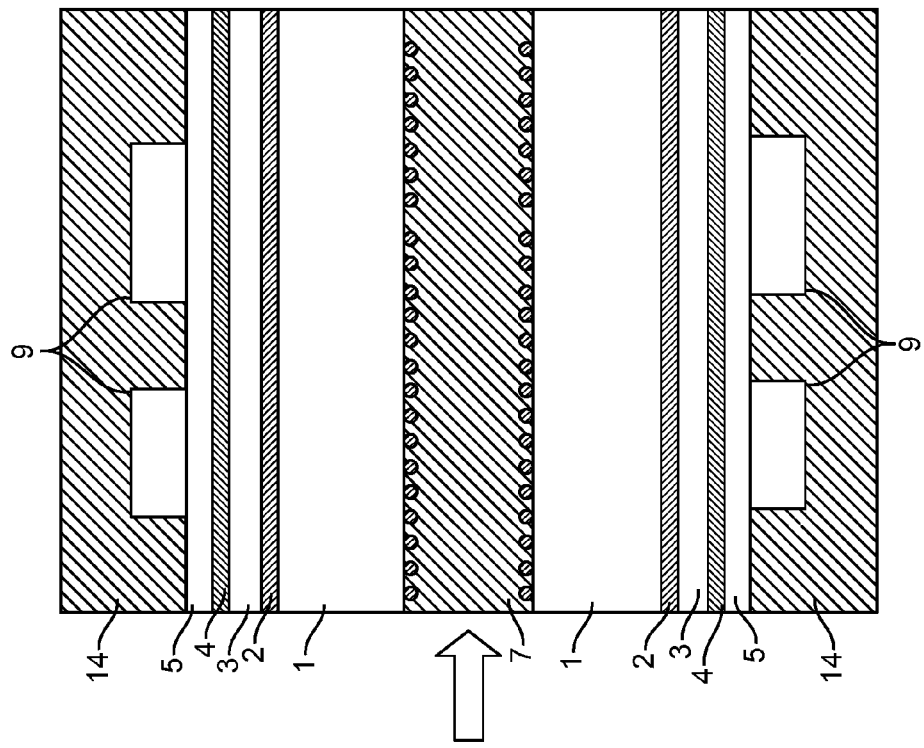
FIG. 7 is a depiction of the patterned construct of FIG. 6 with outer substrate material added to the patterned conductive material.

FIG. 7 is a depiction of the patterned construct of FIG. 6 with an outer substrate layer (14) added to the patterned conductive material (9) and the exposed surface of the ultra-thin copper layers (5).

Figure 8:
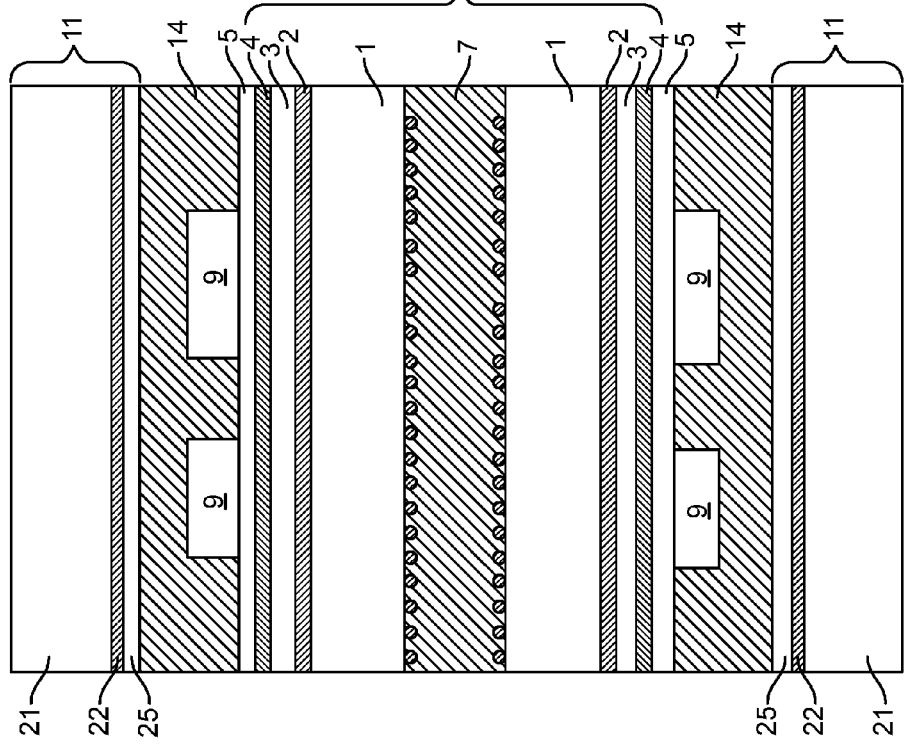
FIG. 8 is a depiction showing the construct of FIG. 7 sandwiched between the ultra-thin copper layers of two conventional multilayer carrier foils of FIG. 1.

FIG. 8 is a depiction showing the construct of FIG. 7 sandwiched between two conventional multilayer carrier foils (11) of FIG. 1. The conventional ultra-thin copper layers (25) of the multilayer carrier foils (11) are applied to the outer substrate layers (14).

Figure 9:
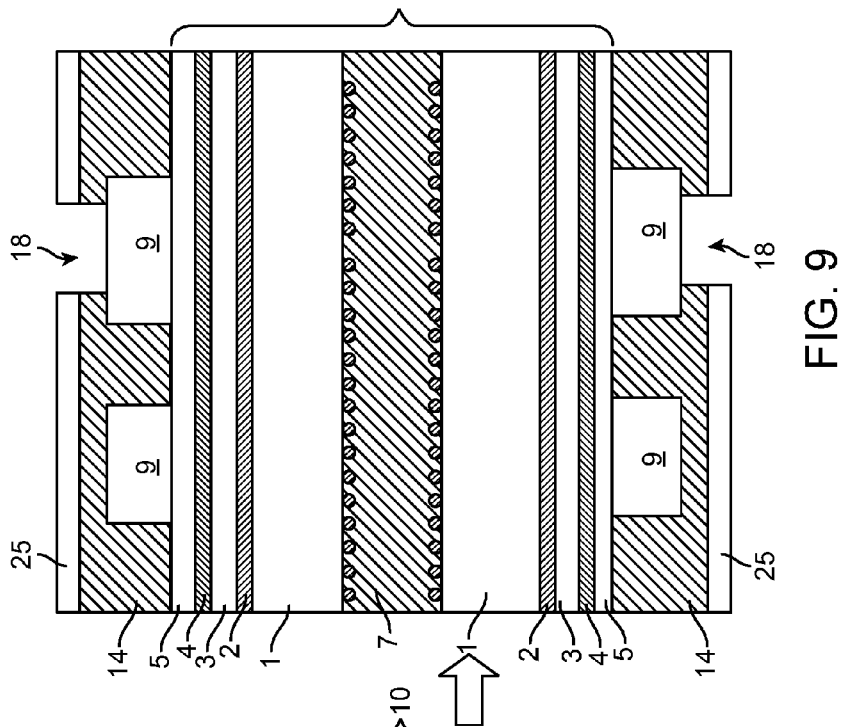
FIG. 9 is a depiction of the construct of FIG. 8 except that the conventional copper carrier layers and the conventional copper chromium release layers have been removed and a pattern of openings has been formed through the conventional ultra-thin copper layers and the outer substrate layers.

FIG. 9 is a depiction of the construct of FIG. 8 except that the conventional copper carrier layers (21) and the conventional copper chromium or organic release layers (22) have been removed. A pattern of openings (18) are incorporated through the conventional ultra-thin copper layers (25) and through the outer substrate layers (14) to the pattern of conductive material (9) on the ultra-thin copper layers (5).

Figure 10:
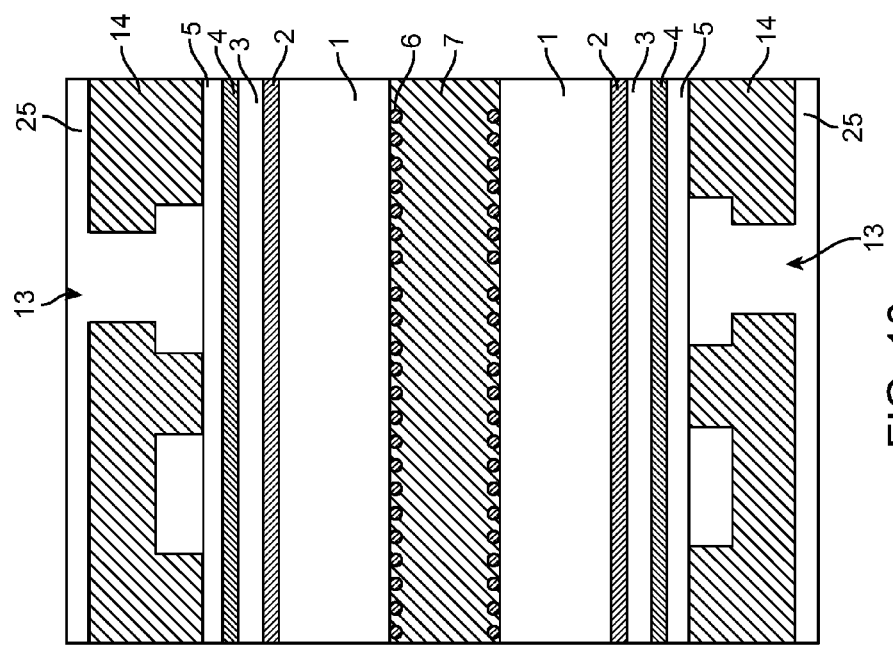
FIG. 10 is a depiction of the construct of FIG. 9 having a pattern of openings filled with an additional conductive material, optionally including additional conductive material (copper) to thicken the ultra-thin copper layer.

FIG. 10 is a depiction of the construct of FIG. 9 having the pattern of openings (18) filled with an additional conductive material (13), which can be copper or another conductive material such as a conductive metal. The additional conductive material (13) used to fill the pattern of openings (18) in FIG. 10 can be the same material or different material than the conductive material (9) used to pattern the ultra-thin copper layers in FIG. 5. Optionally, additional conductive material (13) can be used to thicken the conventional ultra-thin copper layers (see FIG. 11), for instance, by plating.

Figure 11:
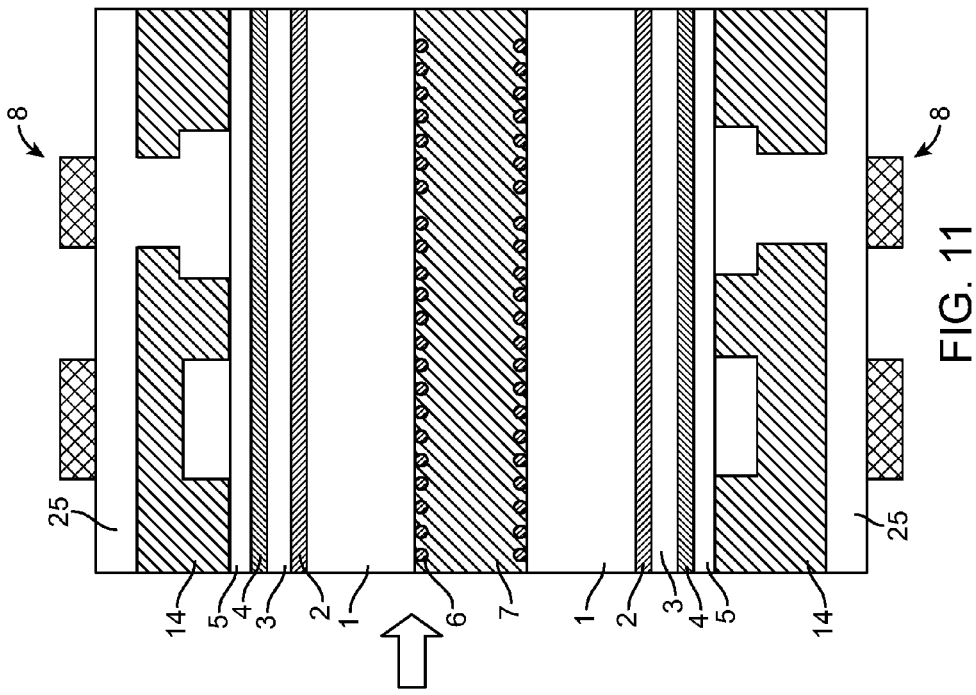
FIG. 11 is a depiction of the construct of FIG. 10 with photoresist layers added to the outside faces of the ultra-thin copper layer.

FIG. 11 is similar to FIG. 10 except that the additional conductive material (13) has been built-up to thicken the conventional ultra-thin copper layers (25) and photoresist layers (8) have been applied to the outer surface of the thickened conventional ultra-thin copper layers (25). The photoresist layers (8) may be applied in a pattern or can be applied so as to completely cover the ultra-thin copper layers (5) and subsequently processed to remove parts of the photoresist layer to form a pattern (e.g., by etching, etc.).

FIG. 11 is similar to FIG. 10 except that the additional conductive material (13) has been built-up to thicken the conventional ultra-thin copper layers (25) and photoresist layers (8) have been applied to the outer surface of the thickened conventional ultra-thin copper layers (25). The photoresist layers (8) may be applied in a pattern or can be applied so as to completely cover the ultra-thin copper foil (5) and subsequently processed to remove parts of the photoresist layer to form a pattern (e.g., by etching, etc.).

Figures 12, 13:
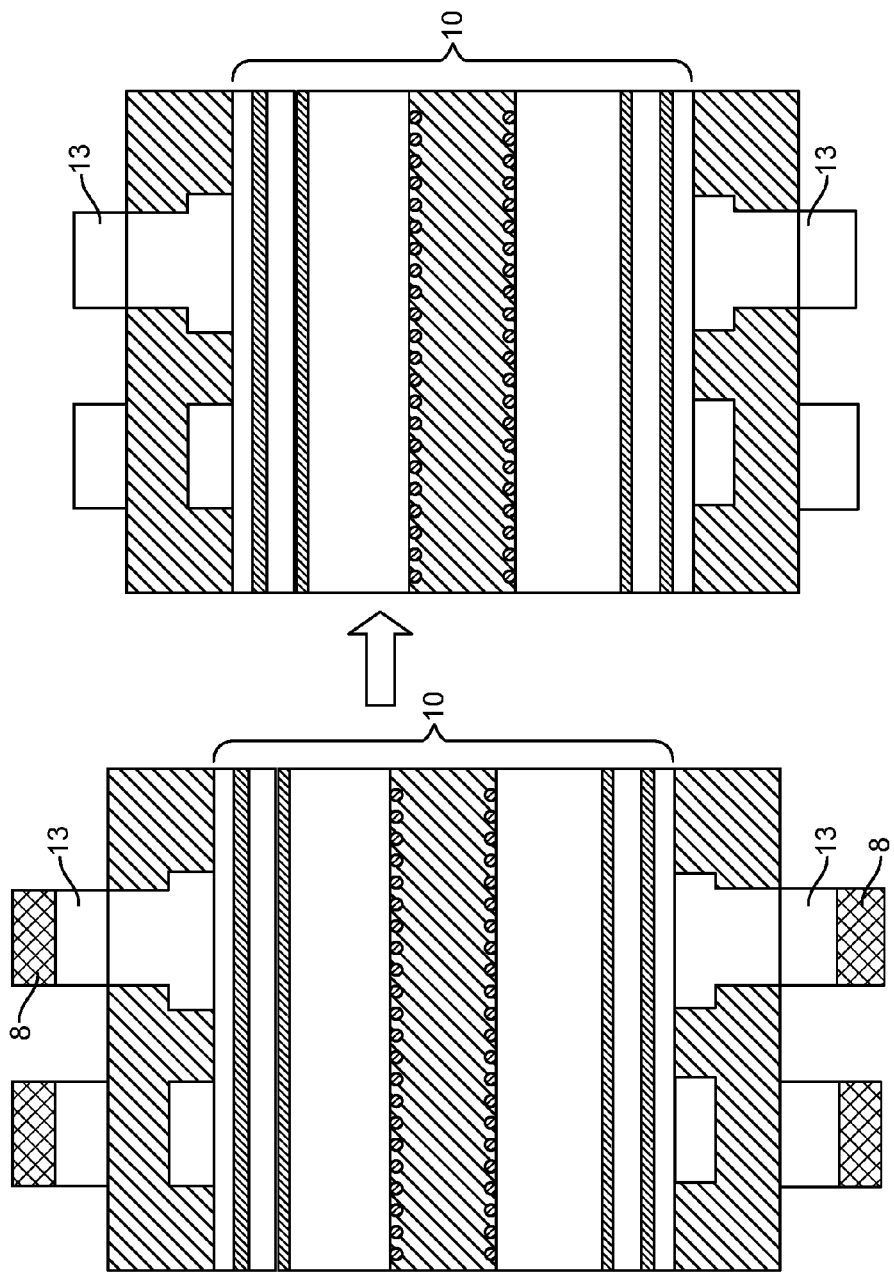
FIG. 12 is a depiction of the construct of FIG. 11 having the ultra-thin copper layers (which optionally have been thickened) removed from the area not protected by the photoresist layers.
FIG. 13 is a depiction of the construct of FIG. 12 having the photoresist layers removed.

FIG. 12 is similar to FIG. 11 except that the area of the thickened conventional ultra-thin copper layers has been removed from the area not protected by the photoresist layers (8). The thickened conventional ultra-thin copper layers not protected by photoresist layers (8) can be removed, for example, by etching.

FIG. 13 is similar to FIG. 12 except that the photoresist layers have been removed, thereby exposing the additional conductive material (13);

FIG. 14 is a depiction showing detachment along the chromium release layers (2) of the patterned, outer substrate layers (14), the ultra-thin copper layers (5), the anti-migration layers (4), and the intermediate copper layers (3);

FIG. 15 is a depiction of a patterned outer substrate layer (14) after removal of the intermediate copper layer (3), the anti-migration layer (4), and the ultra-thin copper layer (5), for example, by etching. A pattern of additional conductive material (13) is shown.

FIG. 16 is depiction of the patterned outer substrate layer of FIG. 15 having a pattern of additional conductive material (13) bonded to an electrical device (30).

For ease of reference, the numerals set forth in the figures are described below in the following key.

TABLE 1

Key for Figures

| Designation | Description |
|---|---|
| 1 | Copper Carrier Layer |
| 2 | Chromium Release Layer |
| 3 | Intermediate Copper Layer |
| 4 | Anti-Migration Layer |
| 5 | Ultra-Thin Copper Layer |
| 6 | Nodule |
| 7 | Inner Substrate Layer |
| 8 | Photoresist Layer |
| 9 | Conductive Material |
| 10 | Core Structure |
| 11 | Conventional Multilayer Carrier Foil |
| 12 | Inventive Multilayer Carrier Foil |
| 13 | Additional Conductive Material |
| 14 | Outer Substrate Layer |
| 16 | release side |
| 17 | laminate side |
| 18 | Opening |
| 21 | Conventional Copper Carrier Layer |
| 22 | Conventional Chromium or Organic Release Layer |
| 25 | Conventional Ultra-Thin Copper Layer |
| 30 | Electronic device |

EXAMPLES

Preparation of Copper Carrier Layer

Copper wires were dissolved in an aqueous solution of 50 wt. % of sulfuric acid to prepare a copper sulfate electrolyte containing 320 g/L of copper sulfate ($CuSO_4.5H_2O$) and 110 g/L of sulfuric acid. To every liter of the copper sulfate electrolyte, 5.5 mg of a low-molecular-weight gel (DV, manufactured by Nippi, Inc.), 3 mg of sodium 3-mercaptopropane sulphonate (MPS, manufactured by Hopax Chemicals Manufacturing Company Ltd.), 25 mg of hydrochloric acid (manufactured by RCI Labscan Ltd.) were added. An electrodeposited copper foil with a thickness of 18 µm was prepared at a liquid temperature of 50° C. and a current density of 50 $A/dm^2$.

A typical device for manufacturing copper foil comprised a metal cathode drum and an insoluble metal anode, the metal cathode drum being rotatable and having a mirror polished surface. The insoluble metal anode was arranged at approximately the lower half of the metal cathode drum and surrounded the metal cathode drum. A copper foil was continuously manufactured with the device by flowing a copper electrolytic solution between the cathode drum and the anode, applying an electrical current between these to allow copper to be electrodeposited on the cathode drum, and detaching an electrodeposited copper from the cathode drum.

The copper foil so produced has a drum side (the surface of the copper foil formed on the cathode drum) and a deposited side (the surface of the copper foil in contact with the copper electrolytic solution) which is on the surface of the copper foil opposite the drum side.

Either the drum side or the deposited side can be the laminated side. If one side is chosen as laminated side, the other side is release side.

Addition of Nodules

Nodules were plated onto the laminate side of the copper carrier layer (above) using a copper sulfate plating solution containing 95 g/L of copper sulfate (CuSO4-5H2O), 115 g/L of sulfuric acid, and 3.5 ppm of chloride ion, at a temperature of 25° C. using a current density of 50 A/dm2 for 3 seconds.

Preparation of Release Layer

The electrodeposited copper foil with nodules having a thickness of 18 µm (from above) was immersed into a 5 g/L chromate solution at a temperature of 50° C. The release side of the copper foil was plated with a current density of 5 $A/dm^2$ for 2 seconds.

Preparation of an Intermediate Copper Layer

An intermediate copper layer was added to the release layer applied to the release side of the carrier layer using a copper sulfate plating solution containing 220 g/L of copper sulfate ($CuSO_4.5H_2O$), 115 g/L of sulfuric acid, and 5 ppm of chloride ion, at a temperature of 25° C. using a current density of 8 $A/dm^2$ for 10 seconds.

Preparation of Anti-Migration Layer

An anti-migration layer was added to the intermediate copper layer using an plating solution containing 300 g/L of nickel sulfate ($NiSO_4.7H_2O$) and 40 g/L of boric acid ($H_3BO_3$) at a temperature of 50° C. using a current density of 10 $A/dm^2$ for 10 seconds.

Preparation of Ultra-Thin Cu Layer

Copper wires were dissolved in an aqueous solution of 50 wt. % of sulfuric acid to prepare a copper sulfate plating solution containing 320 g/L of copper sulfate ($CuSO_4.5H_2O$) and 110 g/L of sulfuric acid. To every liter of the copper sulfate electrolyte, 5.5 mg of a low-molecular-weight gel (DV, manufactured by Nippi, Inc.), 3 mg of sodium 3-mercaptopropane sulphonate (MPS, manufactured by Hopax Chemicals Manufacturing Company Ltd.), 25 mg of hydrochloric acid (manufactured by RCI Labscan Ltd.) were added. An electrodeposited copper foil with thickness of 3

µm was added to the anti-migration layer (above) at a liquid temperature of 50° C. and a current density of 20 A/dm². The plating time is 45 seconds.

Anti-Tarnish Treatment

The multilayer copper foil having a copper carrier layer, a release layer, an intermediate copper layer, an anti-migration layer and an ultra-thin copper layer (above) was immersed in a 2 g/L chromate solution at a temperature of 50° C. Both the ultra-thin copper layer side and the laminate side of the copper carrier layer were plated using a current density of 1.5 A/dm2 to provide an anti-tarnish treatment. The plating time was 2 seconds.

Peel Test

The multilayer copper foil (20 cm×20 cm) was laminated by hot-pressing between two pieces of polyethylene terephthalate (PET) film at 120° C. for 5 seconds. Then sample pieces with a size of 1.27 cm×15 cm were prepared by cutting. The peel test was carried out at a speed of 1 mm/sec at a 90° angle at the release interface between the copper carrier layer and the intermediate copper layer.

Pinhole Test

The multilayer copper foil (10 cm×10 cm) was laminate by hot-pressing between two pieces of polyethylene terephthalate (PET) film at 120° C. for 5 seconds. The copper carrier layer was then removed to leave the intermediate copper layer, the anti-migration layer and ultra-thin copper layer together, which was put under light for evaluation of pinholes. The samples were ranked from 1 to 5, where the number 1 relates to many pinholes and 5 relates to very few or no pinholes.

Etching Test

The multilayer copper foil (10 cm×10 cm) was laminated to a FR-4 prepreg by hot-pressing to the laminate (carrier) side, which is referred to as the deposited side of carrier. The ultra-thin copper foil was laminated to a polyethylene terephthalate (PET) film (a protective film). The specimen was immersed in $FeCl_3$ + HCl solution at 30° C. for 1 minute. A cross-sectional area was evaluated with a microscope to determine whether the anti-migration layer was durable enough to protect the ultra-thin copper layer from damage.

Plating condition and data for twelve examples and five comparative examples are presented in the table below.

TABLE 2

Manufacturing Conditions

| | Copper Carrier layer | | | | | | | Nodules | | | | | |
|---|---|---|---|---|---|---|---|---|---|---|---|---|---|
| Unit | Copper sulfate g/l | Sulfuric acid g/l | Current Density A/dm² | DV ppm | MPS ppm | Cl- ppm | Temp. ° C. | Copper sulfate g/l | Sulfuric acid g/l | Current Density A/dm² | Cl ppm | Temp. ° C. | Time s |
| Ex. 1 | 320 | 110 | 50 | 5.5 | 3 | 25 | 50 | 95 | 115 | 50 | 3.5 | 25 | 3 |
| Ex. 2 | 320 | 110 | 50 | 5.5 | 3 | 25 | 50 | 95 | 115 | 50 | 3.5 | 25 | 3 |
| Ex. 3 | 320 | 110 | 50 | 5.5 | 3 | 25 | 50 | 95 | 115 | 50 | 3.5 | 25 | 3 |
| Ex. 4 | 320 | 110 | 50 | 5.5 | 3 | 25 | 50 | 95 | 115 | 50 | 3.5 | 25 | 3 |
| Ex. 5 | 320 | 110 | 50 | 5.5 | 3 | 25 | 50 | 95 | 115 | 50 | 3.5 | 25 | 3 |
| Ex. 6 | 320 | 110 | 50 | 5.5 | 3 | 25 | 50 | 95 | 115 | 50 | 3.5 | 25 | 3 |
| Ex. 7 | 320 | 110 | 50 | 5.5 | 3 | 25 | 50 | 95 | 115 | 50 | 3.5 | 25 | 3 |
| Ex. 8 | 320 | 110 | 50 | 5.5 | 3 | 25 | 50 | 95 | 115 | 50 | 3.5 | 25 | 3 |
| Ex. 9 | 320 | 110 | 50 | 5.5 | 3 | 25 | 50 | 95 | 115 | 50 | 3.5 | 25 | 3 |
| Ex. 10 | 320 | 110 | 50 | 5.5 | 3 | 25 | 50 | 95 | 115 | 50 | 3.5 | 25 | 3 |
| Ex. 11 | 320 | 110 | 50 | 5.5 | 3 | 25 | 50 | 95 | 115 | 50 | 3.5 | 25 | 3 |
| Ex. 12 | 320 | 110 | 50 | 5.5 | 3 | 25 | 50 | 95 | 115 | 50 | 3.5 | 25 | 3 |
| Comp. Ex. 1 | 320 | 110 | 50 | 5.5 | 3 | 25 | 50 | 95 | 115 | 50 | 3.5 | 25 | 3 |
| Cornp. Ex. 2 | 320 | 110 | 50 | 5.5 | 3 | 25 | 50 | 95 | 115 | 50 | 3.5 | 25 | 3 |
| Comp. Ex. 3 | 320 | 110 | 50 | 5.5 | 3 | 25 | 50 | 95 | 115 | 50 | 3.5 | 25 | 3 |
| Comp. Ex. 4 | 320 | 110 | 50 | 5.5 | 3 | 25 | 50 | 95 | 115 | 50 | 3.5 | 25 | 3 |
| Comp. Ex. 5 | 320 | 110 | 50 | 5.5 | 3 | 25 | 50 | 95 | 115 | 50 | 3.5 | 25 | 3 |

| | Chromium Release layer | | | | Intermediate Copper layer | | | | | | Anti-migration layer | | |
|---|---|---|---|---|---|---|---|---|---|---|---|---|---|
| Unit | Chromate g/l | Temp. ° C. | Current density A/dm² | Time s | Copper sulfate g/l | Sulfuric acid g/l | Current Density A/dm² | Cl- ppm | Temperature ° C. | Time s | Nickle sulfate g/l | Boric acid g/l | Current Density A/dm² |
| Ex. 1 | 5 | 50 | 5 | 2 | 220 | 115 | 8 | 5 | 25 | 10 | 300 | 40 | 10 |
| Ex. 2 | 5 | 50 | 5 | 2 | 220 | 115 | 8 | 5 | 25 | 10 | 300 | 40 | 10 |
| Ex. 3 | 5 | 50 | 5 | 2 | 220 | 115 | 8 | 5 | 25 | 60 | 300 | 40 | 10 |
| Ex. 4 | 5 | 50 | 5 | 2 | 220 | 115 | 8 | 5 | 25 | 60 | 300 | 40 | 10 |
| Ex. 5 | 5 | 50 | 5 | 2 | 220 | 115 | 8 | 5 | 25 | 100 | 300 | 40 | 10 |
| Ex. 6 | 5 | 50 | 5 | 2 | 220 | 115 | 8 | 5 | 25 | 100 | 300 | 40 | 10 |
| Ex. 7 | 10 | 50 | 5 | 4 | 220 | 115 | 8 | 5 | 25 | 10 | 300 | 40 | 10 |
| Ex. 8 | 10 | 50 | 5 | 4 | 220 | 115 | 8 | 5 | 25 | 10 | 300 | 40 | 10 |
| Ex. 9 | 10 | 50 | 5 | 4 | 220 | 115 | 8 | 5 | 25 | 60 | 300 | 40 | 10 |
| Ex. 10 | 10 | 50 | 5 | 4 | 220 | 115 | 8 | 5 | 25 | 60 | 300 | 40 | 10 |
| Ex. 11 | 10 | 50 | 5 | 4 | 220 | 115 | 8 | 5 | 25 | 100 | 300 | 40 | 10 |
| Ex. 12 | 10 | 50 | 5 | 4 | 220 | 115 | 8 | 5 | 25 | 100 | 300 | 40 | 10 |

TABLE 2-continued

| | Manufacturing Conditions | | | | | | | | | | | | | |
|---|---|---|---|---|---|---|---|---|---|---|---|---|---|---|
| Comp. Ex. 1 | 5 | 50 | 5 | 1 | 220 | 115 | 8 | 5 | 25 | 10 | 300 | 40 | 10 | |
| Comp. Ex. 2 | 15 | 50 | 5 | 4 | 220 | 115 | 8 | 5 | 25 | 10 | 300 | 40 | 10 | |
| Comp. Ex. 3 | 5 | 50 | 5 | 2 | — | — | — | — | — | — | 300 | 40 | 10 | |
| Comp. Ex. 4 | 5 | 50 | 5 | 2 | 220 | 115 | 8 | 5 | 25 | 60 | — | — | — | |
| Comp. Ex. 5 | 5 | 50 | 5 | 2 | 220 | 115 | 8 | 5 | 25 | 60 | 300 | 40 | 10 | |

| | Anti-migration layer | | | Ultra-thin Copper layer | | | | | | | Anti-tarnish layer | | | |
|---|---|---|---|---|---|---|---|---|---|---|---|---|---|---|
| Unit | Temperature ° C. | Time s | Copper sulfate g/l | Sulfuric acid g/l | Current Density A/dm² | DV ppm | MPS ppm | Cl- ppm | Temp. ° C. | Time s | Chromate g/l | Current Density A/dm² | Temp. ° C. | Time s |
| Ex. 1 | 50 | 10 | 320 | 110 | 20 | 5.5 | 3 | 25 | 50 | 45 | 2 | 1.5 | 50 | 2 |
| Ex. 2 | 50 | 60 | 320 | 110 | 20 | 5.5 | 3 | 25 | 50 | 45 | 2 | 1.5 | 50 | 2 |
| Ex. 3 | 50 | 10 | 320 | 110 | 20 | 5.5 | 3 | 25 | 50 | 45 | 2 | 1.5 | 50 | 2 |
| Ex. 4 | 50 | 60 | 320 | 110 | 20 | 5.5 | 3 | 25 | 50 | 45 | 2 | 1.5 | 50 | 2 |
| Ex. 5 | 50 | 10 | 320 | 110 | 20 | 5.5 | 3 | 25 | 50 | 45 | 2 | 1.5 | 50 | 2 |
| Ex. 6 | 50 | 60 | 320 | 110 | 20 | 5.5 | 3 | 25 | 50 | 45 | 2 | 1.5 | 50 | 2 |
| Ex. 7 | 50 | 10 | 320 | 110 | 20 | 5.5 | 3 | 25 | 50 | 45 | 2 | 1.5 | 50 | 2 |
| Ex. 8 | 50 | 60 | 320 | 110 | 20 | 5.5 | 3 | 25 | 50 | 45 | 2 | 1.5 | 50 | 2 |
| Ex. 9 | 50 | 10 | 320 | 110 | 20 | 5.5 | 3 | 25 | 50 | 45 | 2 | 1.5 | 50 | 2 |
| Ex. 10 | 50 | 60 | 320 | 110 | 20 | 5.5 | 3 | 25 | 50 | 45 | 2 | 1.5 | 50 | 2 |
| Ex. 11 | 50 | 10 | 320 | 110 | 20 | 5.5 | 3 | 25 | 50 | 45 | 2 | 1.5 | 50 | 2 |
| Ex. 12 | 50 | 60 | 320 | 110 | 20 | 5.5 | 3 | 25 | 50 | 45 | 2 | 1.5 | 50 | 2 |
| Comp. Ex. 1 | 50 | 10 | 320 | 110 | 20 | 5.5 | 3 | 25 | 50 | 45 | 2 | 1.5 | 50 | 2 |
| Comp. Ex. 2 | 50 | 10 | 320 | 110 | 20 | 5.5 | 3 | 25 | 50 | 45 | 2 | 1.5 | 50 | 2 |
| Comp. Ex. 3 | 50 | 10 | 320 | 110 | 20 | 5.5 | 3 | 25 | 50 | 45 | 2 | 1.5 | 50 | 2 |
| Comp. Ex. 4 | — | — | 320 | 110 | 20 | 5.5 | 3 | 25 | 50 | 45 | 2 | 1.5 | 50 | 2 |
| Comp. Ex. 5 | 50 | 80 | 320 | 110 | 20 | 5.5 | 3 | 25 | 50 | 45 | 2 | 1.5 | 50 | 2 |

TABLE 3

(Testing Results)

| | Chromium Release Layer (µg/dm²) | Intermediate Copper Layer (µm) | Anti-Migration Layer (µm) | Ultra-Thin Copper Layer (µm) | Peeling Strength (g/cm) | Pinhole Rank | Etching Resistance | Note |
|---|---|---|---|---|---|---|---|---|
| Ex. 1 | 10 | 0.5 | 0.5 | 3 | 15.15 | 4 | OK | |
| Ex. 2 | 10 | 0.5 | 3 | 3 | 14.56 | 5 | OK | |
| Ex. 3 | 10 | 3 | 0.5 | 3 | 15.22 | 5 | OK | |
| Ex. 4 | 10 | 3 | 3 | 3 | 14.85 | 5 | OK | |
| Ex. 5 | 10 | 5 | 0.5 | 3 | 14.93 | 5 | OK | |
| Ex. 6 | 10 | 5 | 3 | 3 | 14.78 | 5 | OK | |
| Ex. 7 | 40 | 0.5 | 0.5 | 3 | 10.13 | 4 | OK | |
| Ex. 8 | 40 | 0.5 | 3 | 3 | 10.54 | 5 | OK | |
| Ex. 9 | 40 | 3 | 0.5 | 3 | 10.66 | 5 | OK | |
| Ex. 10 | 40 | 3 | 3 | 3 | 10.72 | 5 | OK | |
| Ex. 11 | 40 | 5 | 0.5 | 3 | 11.15 | 5 | OK | |
| Ex. 12 | 40 | 5 | 3 | 3 | 11.23 | 5 | OK | |
| Comp. Ex. 1 | 5 | 0.5 | 0.5 | 3 | Not Peelable | NA | NA | |
| Comp. Ex. 2 | 60 | 0.5 | 0.5 | 3 | No Adhesion | NA | NA | |
| Comp. Ex. 3 | 10 | 0 | 0.5 | 3 | 14.32 | 1 | OK | |
| Comp. Ex. 4 | 10 | 3 | 0 | 3 | 14.65 | 4 | Poor | |
| Comp. Ex. 5 | 10 | 3 | 4 | 3 | 14.55 | 5 | OK | Too Much Residual Ni |

The chromium content that forms the chromium release layer was determined by firstly separating copper carrier layer (1) from the intermediate copper layer (3), anti-migration layer (4) and ultra-thin copper layer (5) by peeling the chromium release layer (2). Secondly, a 100 mm×100 mm sample of the copper carrier layer (1) was immersed in 25 ml 18% v/v HCl solution for 10 minutes while the laminate side was sealed by PET tape. The other peeled part followed the same procedure by immersing 100 mm×100 mm sample of the composite containing the intermediate copper layer (3), anti-migration layer (4) and ultra-thin copper layer (5) in 25 ml 18% v/v HCl solution for 10 minutes while the ultra-thin copper layer side was sealed by PET tape. The resulting solutions of the above two tests were made up with water to 50 ml and then were analyzed according to ICP-AES (Inductively coupled plasma with atomic emission spectroscopy). The chromium content was determined from the summation of above two tests.

The thickness of the intermediate copper layer, the anti-migration layer, and the ultra-thin copper layer was determined by first using FIB (Focused Ion Beam) to polish the cross-sectional surface of the multilayer carrier foil. Then, SEM (Scanning Electron Microscopy) was used to measure the thickness of the intermediate copper layer, the anti-migration layer, and the ultra-thin copper layer, using a magnification of 20,000.

Comparative Example 1 illustrates that if the chromium content of chromium release layer is too low, it is very difficult or impossible to properly release the intermediate copper foil layer.

Comparative Example 2 illustrates that if the chromium content of chromium release layer is too high, the intermediate layer separates very easily from the chromium release layer.

Comparative Example 3 illustrates that the intermediate copper foil layer is important for preventing pinholes. A very thick intermediate copper foil layer causes no harm but results in unnecessary expense since ultimately the intermediate copper foil layer is discarded (removed by etching and discarded).

Comparative Example 4 illustrates that the anti-migration layer is necessary for protecting the ultra-thin copper layer from damage during the etching process.

Comparative Example 5 illustrates that if the anti-migration layer is too thick, the etching is incomplete and residual anti-migration material (e.g., nickel) remains.

The above embodiments above are only used to illustrate the principle of the present disclosure and the effect thereof, and should not be construed as to limit the present disclosure. The above embodiments can be modified and altered by those skilled in the art, without departing from the spirit and scope of the present disclosure. Therefore, the protection scope of the present disclosure is defined in the following appended claims. As long as it does not affect the effects and achievable goals of this disclosure, it should be covered under the technical contents disclosed herein.

The terms "a," "an," and "the" are understood to encompass the plural as well as the singular.

The expression "at least one" means "one or more" and vice versa, and thus includes individual components as well as mixtures/combinations.

The term "about" when referring to a value is meant specifically that a measurement can be rounded to the value using standard convention for rounding numbers. For example, "about 1.5" is 1.45 to 1.54. All values set forth herein can be modified with the term "about," if desired, to impart the meaning above, or recited without the term, regardless of whether the term "about" is specifically set forth (or is absent) in conjunction with any particular value in the specification.

The term "directly on" or "directly to" when referring to the various layers of the instant disclosure can be used to clarify that one layer is in physical contact with another layer. For example, the following description of multilayer carrier foil could be used: (a) a copper carrier layer having a release side and a laminate side, the laminate side of copper carrier layer optionally having nodules; (b) a chromium release layer applied "directly to" the copper carrier layer; (c) an intermediate copper layer applied "directly to" the chromium release layer; (d) an anti-migration layer applied "directly" to the intermediate copper layer; and (e) an ultra-thin copper layer applied "directly to" the anti-migration layer. In this example, each layer is in physical contact with the adjacent layer without an intervening layer being present.

All ranges and values disclosed herein are inclusive and combinable. For example, any value or point described herein that falls within a range described herein can serve as a minimum or maximum value to derive a sub-range, etc.

The invention claimed is:

1. A multilayer carrier foil comprising:
   (a) a copper carrier layer having a release side and a laminate side, the laminate side of copper carrier layer optionally having nodules;
   (b) a chromium release layer applied to the release side of the copper carrier layer of (a);
   (c) an intermediate copper layer applied to the chromium release layer of (b);
   (d) an anti-migration layer applied to the intermediate copper layer of (c);
   (e) an ultra-thin copper layer directly applied to the anti-migration layer of (d);
   wherein the anti-migration layer (d) has a thickness of 0.5 µm to 3 µm.

2. A multilayer carrier foil comprising:
   (a) a copper carrier layer having a release side and a laminate side, the laminate side of carrier layer optionally having nodules;
   (b) a chromium release layer applied to the release side of the copper carrier layer of (a);
   (c) an intermediate copper layer applied to the chromium release layer of (b);
   (d) an anti-migration layer applied to the intermediate copper layer of (c); and,
   (e) an ultra-thin copper layer applied to the anti-migration layer of (d);
   wherein the chromium release layer of (b) has chromium content of 10 µg/dm$^2$ to 40 µg/dm$^2$.

3. The multilayer carrier foil of claim 1, wherein the anti-migration layer of (d) is a nickel layer.

4. The multilayer carrier foil of claim 1, wherein the ultra-thin copper layer of (e) has a thickness of 1 µm to 8 µm.

5. The multilayer carrier foil of claim 1, wherein the ultra-thin copper layer of (e) has a thickness of 1 µm to 5 µm.

6. The multilayer carrier foil of claim 1, wherein the copper carrier layer of (a) has a thickness of 10 µm to 50 µm.

7. The multilayer carrier foil of claim 1, further comprising an anti-tarnish layer on an exposed surface of the ultra-thin copper layer and/or on an exposed surface of the laminate side of the copper carrier layer.

8. The multilayer carrier foil of claim 7, wherein the anti-tarnish layer comprises chromium.

9. A core structure comprising an inner substrate layer sandwiched between two sheets of a multilayer carrier foil of claim 1, wherein both sides of the inner substrate layer attach to the laminate side of both sheets of the copper carrier foil.

10. The core structure of claim 9, wherein the inner substrate layer comprises a phenolic resin, an epoxy, a bismaleimide triazine, a polyimide, a liquid crystal polymer, a polyphenylene oxide, a polyphenylene ether, a polytetrafluoroethylene, a cyanate ester, and a mixture thereof.

11. A method for manufacturing a multilayer carrier foil of claim 1 comprising:
 (a) forming a copper carrier layer having a release side and a laminate side, the laminate side of copper carrier layer optionally having nodules;
 (b) forming a chromium release layer on the release side of the copper carrier layer of (a);
 (c) forming an intermediate copper layer on the chromium release layer of (b);
 (d) forming an anti-migration layer on the intermediate copper layer of (c);
 (e) forming an ultra-thin copper layer directly on the anti-migration layer of (d);
 wherein the anti-migration layer (d) has a thickness of 0.5 µm to 3 µm.

12. A method for manufacturing a printed circuit board comprising:
 i. obtaining a multilayer carrier foil of claim 1;
 ii. forming a core structure comprising an inner substrate layer sandwiched between sheets of the multilayer carrier foil, wherein both sides of the inner substrate layer attach to the laminate side of a sheet of the copper carrier foil;
 iii. patterning an exposed surface of the ultra-thin copper layers;
 iv. applying an outer substrate layer to the patterned ultra-thin copper layers;
 v. obtaining a conventional carrier foil comprising:
  (A) a conventional copper carrier layer;
  (B) a conventional chromium or organic release layer applied to the conventional copper carrier layer of (A); and
  (C) a conventional ultra-thin copper layer applied to the conventional chromium or organic release layer of (B); and applying the conventional ultra-thin copper layer of the conventional carrier foil to the outer substrate layer of (iv);
 vi. removing the conventional copper carrier layers and the conventional chromium or organic release layers from the conventional ultra-thin copper layers;
 vii. forming openings through the conventional ultra-thin copper layers and the outer substrate layers;
 viii. filing the openings with a conductive material and optionally patterning an exposed surface of the conventional ultra-thin copper layers and/or an exposed surface of the filled openings of (viii);
 ix. separating the patterned conventional ultra-thin copper layers, which are attached to the outer substrates, which are attached to the anti-migration layers, which are attached to the intermediate copper layers from the chromium release layers;
 x. removing the intermediate copper layers, the anti-migration layers, and the ultra-thin copper layers to form a remaining patterned outer substrate layer; and
 xi. bonding the remaining patterned outer substrate layer to an electronic device.

13. The method of claim 12, wherein patterning an exposed surface of the ultra-thin copper layers in (iii) or patterning an exposed surface of the conventional ultra-thin copper layers and/or an exposed surface of the filled openings of (viii) in (xiii) comprises applying a patterned photoresist layer to the exposed surface and patterning the exposed surface with a conductive material by plating or etching, and removing the patterned photoresist layers.

14. The method of claim 13, wherein the conductive material comprises copper.

15. The method of claim 14, wherein the outer substrate layer of (iv) comprises a phenolic resin, an epoxy, a bismaleimide triazine, a polyimide, a liquid crystal polymer, a polyphenylene oxide, a polyphenylene ether, a polytetrafluoroethylene, a cyanate ester, and a mixture thereof.

16. The method of claim 12, wherein forming openings through the conventional ultra-thin copper layers is carried out with a laser.

17. A printed circuit board made by the method of claim 12.

18. An electronic device comprising the printed circuit board of claim 17.

19. The multilayer carrier foil of claim 1, wherein the intermediate copper layer (c) has a thickness of 0.5 µm to 5 µm.

* * * * *